United States Patent
Hauser et al.

(10) Patent No.: US 7,692,515 B2
(45) Date of Patent: Apr. 6, 2010

(54) LOW-LOSS ELECTRO-ACOUSTIC COMPONENT

(75) Inventors: Markus Hauser, Feldafing (DE); Michael Jakob, Munich (DE); Ulrike Roesler, Hebertshausen (DE); Werner Ruile, Munich (DE)

(73) Assignee: EPCOS AG, Munich (DE)

( * ) Notice: Subject to any disclaimer, the term of this patent is extended or adjusted under 35 U.S.C. 154(b) by 239 days.

(21) Appl. No.: 11/659,166

(22) PCT Filed: Jun. 7, 2005

(86) PCT No.: PCT/EP2005/006116

§ 371 (c)(1), (2), (4) Date: Mar. 1, 2007

(87) PCT Pub. No.: WO2006/015639

PCT Pub. Date: Feb. 16, 2006

(65) Prior Publication Data
US 2007/0241841 A1 Oct. 18, 2007

(30) Foreign Application Priority Data
Aug. 4, 2004 (DE) .................... 10 2004 037 819

(51) Int. Cl.
H03H 9/72 (2006.01)
H03H 9/64 (2006.01)
(52) U.S. Cl. .................. 333/133; 333/193; 333/195
(58) Field of Classification Search .............. 333/193, 333/195, 133
See application file for complete search history.

(56) References Cited

U.S. PATENT DOCUMENTS

| 4,193,045 | A | | 3/1980 | Houkawa et al. |
| 4,387,355 | A | | 6/1983 | Uno et al. |
| 5,073,763 | A | | 12/1991 | Wright |
| 5,631,515 | A | * | 5/1997 | Mineyoshi et al. ...... 310/313 B |
| 5,682,126 | A | * | 10/1997 | Plesski et al. ............... 333/193 |
| 5,729,186 | A | * | 3/1998 | Seki et al. .................... 333/194 |
| 6,037,847 | A | | 3/2000 | Ueda et al. |
| 6,163,099 | A | | 12/2000 | Kadota et al. |
| 6,271,617 | B1 | * | 8/2001 | Yoneda et al. .......... 310/313 D |

(Continued)

FOREIGN PATENT DOCUMENTS

DE 196 41 662 4/1997

(Continued)

OTHER PUBLICATIONS

Machine translation of JP 10-079641 published Mar. 24, 1998.*

(Continued)

*Primary Examiner*—Barbara Summons
(74) *Attorney, Agent, or Firm*—Fish & Richardson P.C.

(57) ABSTRACT

A component includes a filter having a first structure and a second structure. The component also includes a substrate on which the first and second structures are arranged. The first structure has an approximately uniform layer thickness and an approximately uniform composition. The second structure has an approximately uniform layer thickness and an approximately uniform composition. At least one of the layer thickness or composition of the first structure differs from the layer thickness or composition of the second structure.

18 Claims, 5 Drawing Sheets

U.S. PATENT DOCUMENTS

| | | | |
|---|---|---|---|
| 6,339,365 B1 * | 1/2002 | Kawase et al. | 333/193 |
| 6,369,674 B1 * | 4/2002 | Matsumoto et al. | 333/195 |
| 6,377,138 B1 * | 4/2002 | Takagi et al. | 333/193 |
| 6,498,548 B2 * | 12/2002 | Kaneda et al. | 333/195 |
| 6,570,470 B2 * | 5/2003 | Maehara et al. | 333/193 |
| 6,710,514 B2 * | 3/2004 | Ikada et al. | 310/313 C |
| 6,713,940 B2 * | 3/2004 | Takamine | 310/313 R |
| 6,717,487 B2 * | 4/2004 | Takata | 333/133 |
| 6,833,774 B2 * | 12/2004 | Abbott et al. | 333/193 |
| 6,853,269 B2 * | 2/2005 | Nakamura et al. | 333/193 |
| 6,963,257 B2 * | 11/2005 | Ella et al. | 333/133 |
| 6,975,180 B2 * | 12/2005 | Nakamura et al. | 333/133 |
| 7,057,478 B2 * | 6/2006 | Korden et al. | 333/189 |
| 7,102,460 B2 * | 9/2006 | Schmidhammer et al. | 333/133 |
| 7,212,083 B2 * | 5/2007 | Inoue et al. | 333/189 |
| 2003/0117238 A1 | 6/2003 | Takeishi et al. | |
| 2003/0117240 A1 | 6/2003 | Inoue et al. | |
| 2004/0095207 A1 | 5/2004 | Nakamura et al. | |
| 2004/0196116 A1 * | 10/2004 | Komuro et al. | 333/133 |

FOREIGN PATENT DOCUMENTS

| | | | | |
|---|---|---|---|---|
| DE | 101 53 434 | 5/2003 | | |
| EP | 0 936 734 | 8/1999 | | |
| EP | 1 056 202 | 11/2000 | | |
| JP | 03-247109 | * 11/1991 | | 333/193 |
| JP | 08-008680 | * 1/1996 | | |
| JP | 09-232908 | * 9/1997 | | |
| JP | 10-079641 | * 3/1998 | | |
| JP | 10-145172 | * 5/1998 | | |
| JP | 10-178328 | * 6/1998 | | |
| JP | 10-335965 | * 12/1998 | | |
| WO | WO 03/073611 | * 9/2003 | | |

OTHER PUBLICATIONS

Knuuttila, J. V. et al "Measurement of BAW Radiation from Low-Loss LSAW Resonators" Electronics Letters, Aug. 2, 2001, vol. 37, No. 16.

International Search Report for PCT/EP2005/006116, dated Dec. 2006.

Written Opinion for PCT/EP2005/006116, dated Dec. 2006.

English translation of the Written Opinion for PCT/EP2005/006116, dated Dec. 2006.

* cited by examiner

LOW-LOSS ELECTRO-ACOUSTIC COMPONENT

TECHNICAL FIELD

A component operating with acoustic waves (e.g., surface acoustic waves or waves propagating along a boundary layer so called guided bulk waves), such as a bandpass filter is disclosed.

BACKGROUND

Surface acoustic wave filters to be employed in front end circuits of wireless telecommunications systems must have a particularly low insertion loss in their transmission band (passband).

To achieve the required relatively large bandwidth, the surface acoustic wave filters are formed on piezoelectric substrates such as $LiTaO_3$ with leaky wave properties. In such substrates, leaky wave losses occur, which can be reduced under certain conditions relevant to the propagation of the surface wave.

It is known from the publication DE 19641662 that a low insertion loss in the passband of the filter is achievable at a defined angle of intersection $\phi$ of the piezoelectric substrate and at a defined layer thickness h of the electrodes. The parameters $\phi$ and h at which the optimal insertion loss occurs are dependent on the material of the metallization.

Achieving a low insertion loss by the adjustment of a defined metallization ratio $\eta$ of the substrate surface is known from the publication US 2003/0117240.

Forming the electrodes from several layers, for instance, a sequence of Al and Cu layers, is known. For reasons of process technology, however, a uniform layer structure with a uniform layer thickness and a uniform metallization ratio is generally selected for the metallization of the electrodes.

Forming some electrode fingers in an electroacoustic transducer with a higher layer thickness than the other electrode fingers is known from the publication U.S. Pat. No. 5,073,763. Thereby a directed acoustic reflection or the unidirectional emission of the wave can be achieved.

It may be possible to maintain the required insertion loss at certain critical points within the filter's passband, especially at the passband edges of a filter, only with great difficulty.

SUMMARY

An acoustic component with low insertion loss features low losses in its passband and, in particular, at the edges of the passband.

The insertion loss of the filter at a given frequency is connected to the acoustic reflection, the electroacoustic coupling and the losses in the filter component at this frequency.

The optimum acoustic properties are achieved in a component structure at a given frequency, preferably the resonant frequency of the component structure, (for a predetermined material of the electrode layers and the piezoelectric substrate therebelow) for certain values of the angle of intersection $\phi$, the layer thickness h and the metallization ratio $\eta$.

A filter can have component structures with differing resonant frequencies, for instance, a series resonator and a parallel resonator that are arranged on a piezoelectric substrate. The inventors recognized that it is not feasible to achieve an optimum regarding a low insertion loss of the filter with a uniform layer structure of the electrode layer structures for both resonators or at two different frequencies. For these reasons, it is desirable to adapt the acoustic properties, such as the electroacoustic coupling and the acoustic reflection of the individual component structures (transducers, reflectors, for example) to their characteristic frequencies (e.g., the resonant frequency for a transducer or the lower limit frequency of the stopband for a reflector) or to the critical frequencies of the passband (preferably the band edges). In some embodiments, different layer structures of electrically conductive layers or metal layers are adapted to the respective characteristic frequency for different component structures.

The electroacoustic coupling and the acoustic reflections can be influenced, in particular, by the mass load of the surface of the piezoelectric substrate. The differing electroacoustic coupling and/or acoustic reflection can therefore be achieved in one embodiment by the differing layer thicknesses of the electrode structure of the two component structures. The difference can also be achieved in another embodiment by the differing compositions of the electrode structures for different component structures. Each component structure here has uniform composition, layer thickness and preferably also a uniform metallization ratio.

The filter has component structures selected independently of one another from a transducer and a reflector that operate with acoustic waves. The component structures formed as transducers preferably each have alternately arranged electrode fingers of a first and a second comb like electrode. Each component structure has a uniform composition of its own for its electrode structures or electrode fingers. Two component structures of a filter here have layer thicknesses and/or compositions different from one another.

The acoustic waves can be surface acoustic waves (SAW) or waves propagating along a boundary layer of a multilayer structure (guided boundary layer waves). The guided boundary layer waves propagate in the interior of the layer structure, in contrast to the surface waves.

Component structures are understood to mean an interdigital transducer of a reflector. The component structures have strip-like electrode structures (electrode fingers).

The electrode fingers in a transducer are connected to a busbar. The electrode fingers, connected to differing potentials, are preferably arranged alternately in the longitudinal direction. The electrode structures of a reflector are metal strips, preferably electrically connected to one another.

In one embodiments, one or both component structures can have a single electrically conductive layer.

In one embodiment, the two component structures are each formed by an electrically conductive layer of the same material, with the first and second component structures having different layer thicknesses.

A first and second component structure can each consist of a first or a second material in another embodiment. The layer thickness here is preferably different. The layer thicknesses of the first and second component structure can also be the same.

In another embodiment, the electrode structures of the respective component structure can be formed of several sublayers arranged one above the other. The component structure can have the same sequence of layers, the layer structures having different heights.

It is also possible for the first component structure to consist of only one electrically conductive layer, while the second component structure has a layer structure consisting of several electrically conductive sublayers. It is also possible for the layer structure of the second component structure to comprise the electrically conductive layer of the first component structure as a sublayer.

The electrically conductive layer or electrically conductive sublayers can consist, for instance, of Al, Cu or Al or Cu alloys. These layers can in principle also consist of other suitable materials, for example, Ti, Mg, Ta, Ag or Au. At least one of the sublayers can be a high-power durable material and can serve to increase the power durability of the electrode structures. At least one of the sublayers can be used to reduce the temperature-dependence of the velocity of the acoustic wave. The entire structure can be covered entirely or in part by a passivation layer that seals to the substrate surface and thus encloses the component structures.

The component according to another embodiment operates with acoustic waves that are guided in a thin boundary layer (GBAW=guided bulk acoustic waves, in English). The thickness of the boundary layer can lie between $0.1\lambda$ and $\lambda$. In this case, the component has a first and a second substrate, between which a layer system is arranged. The layer system comprises at least one piezoelectric layer, in which the acoustic wave is guided, arranged on the first substrate. A metal layer, in which the first component structure, the second component structure and contact surfaces are formed, is arranged on top of the piezoelectric layer. The metal layer can have several electrically conductive sublayers. In the area of the first and second component structure, the metal layer has different layer thicknesses. The component structures are covered with a dielectric layer (preferably a planarization layer), which is tightly sealed to the surface of the piezoelectric layer that is free of component structures and contact surfaces. A second substrate is arranged on top of the dielectric layer and tightly connected thereto.

The sublayers of high-power resistant material generally have high resistance, and, for this reason, can worsen the insertion loss of the filter (if such layers are used in all resonators of the filter). It is therefore advantageous to use such sublayers only for those input resonators that are to be exposed to a high transmission power, for instance, those of a transmit filter. An input resonator is understood to mean a resonator that is arranged at the input of the filter, with the input of the filter connected to the output of a power amplifier, for example. The input resonator is connected to the input port and can be arranged in the signal path as well as in a shunt arm connecting the signal path to ground (input-side series resonator, parallel resonator).

A layer structure is understood to mean both multilayer structures of electrically conductive sublayer and a single electrically conductive layer.

A relative layer thickness $h/\lambda$ is understood to mean the ratio of the absolute thickness h of the electrically conductive layer, or the height of the entire layer structure of the electrode structures, to the wavelength $\lambda$.

A metallization ratio is understood to mean the ratio of the metallized surface area to the entire surface area of the active section of the component structure. In one embodiment, it is possible for two component structures to have metallization ratios differing from one another.

The component structures preferably have layer structures of the same type, wherein the layer thickness or the height of the layer structures, depending on the component structure, is different for at least two component structures.

Two component structures with different layer structures, a transducer and a reflector in one embodiment, can be arranged one alongside the other in an acoustic track. In another embodiment, the first and second component structures can each constitute a transducer, the two transducers being arranged side by side in a common acoustic track.

A reflector preferably has a higher layer thickness than the associated transducer arranged in the same acoustic track. The reflectivity at metal strips of a reflector can be increased relative to the reflection intensity in the proximate transducer by a higher layer thickness or a higher metallization ratio. A higher reflector bandwidth is also achieved. In particular, interfering acoustic oscillation that leads to a ripple in the stopband area of the filter can be reduced thereby, or shifted into a noncritical frequency region.

It is also possible to arrange a transducer and a reflector consisting of different layer sequences in an acoustic track. The layer structure of the transducer can have, for example a layer of a metal or a metal alloy, preferably Al, or superimposed sublayers of, for instance, Al and Cu. The electrode structures of the transducer are preferably formed of Cu/Al alloy. The layer structure of the reflector can have a layer of a different metal or a different metal alloy, for example. The layer structure of the reflector can also have superimposed sublayers of, e.g., Al, Cu, Ti, Mg, Ta, etc.

The component structures with the different layer structures can be arranged in another embodiment in different acoustic tracks of the filter that are electrically connected to one another. Each acoustic track is preferably bounded by two reflectors, and has at least one transducer arranged therebetween. Thus an acoustic resonator is formed. Each acoustic track has a uniform composition as well as a uniform layer thickness of the electrode structures contained therein. Two tracks can also have different compositions and/or layer thicknesses. Three or more acoustic tracks, each having different absolute layer thicknesses, can also be arranged in a filter.

In one embodiment, it is possible to form two acoustic tracks with differing metallization ratios. Each acoustic track also has a uniform metallization ratio.

The layer thickness of the track with a lower resonant frequency is preferably smaller that the layer thickness of the track with a higher resonant frequency.

In a reactance filter, for example, a first track can correspond to a series resonator and a second track to a parallel resonator. Differing layer thicknesses are preferably used for parallel and series resonators in a reactance filter. In a filter with series and parallel resonators in a ladder-type arrangement, it is advantageous to select the layer thickness of the electrode structure for series resonators to be thicker than for parallel resonators. The layer thickness here is adapted, for instance, such that the optimum of electroacoustic coupling and acoustic reflection is achieved for series resonators at the first frequency f1 (e.g., at the higher-frequency band edge), and that for parallel resonators at the second frequency f2<f1 (e.g., at the lower-frequency band edge). The metallization ratio is preferably selected to be smaller in the parallel resonator than in the series resonator.

Several filters can be provided in a component, wherein the layer structure of the electrode structures has a different chemical composition and/or a different layer combination in two filters.

The lowest relative layer thickness $h/\lambda$ is preferably more than 5%. The relative layer thickness of the electrode structures preferably lies in the range between 7% and 14%. The metallization ratio preferably lies in the range between 0.3 and 0.8.

The optimization of the layer structure of the individual acoustic tracks or resonators or of the component structures in general is of particular importance in a duplexer with a transmit filter and a receive filter that have different center frequencies. The duplexer has at least four component structures (series resonator of the transmit filter, parallel resonator of the transmit filter, series resonator of the receive filter, parallel resonator of the receive filter) with markedly different resonant frequencies that are arranged on one substrate.

For known duplexers with a uniform layer thickness of the electrode structures for all resonators, only one special type of resonator, for example, the series resonator of the transmit filter, can be optimized with regard to acoustic properties such as reflection and electroacoustic coupling. Losses occur in the resonators of the duplexer due to the resulting mismatching.

In a duplexer, at least two of the aforementioned resonators are now optimized with respect to their associated critical frequencies. Preferably three or four of the aforementioned resonators are optimized.

In one embodiment, the metallization ratio is $\eta=0.65$ in all resonators of the duplexer, the following relative layer thicknesses $h/\lambda$ are selected for the corresponding resonators: 7.0% in the parallel resonator in the transmit filter, 8.3% in the series resonator in the transmit filter; 9.4% in the parallel resonator in the receive filter; 11.2% in the series resonator in the receive filter.

In another embodiment, the following parameters are selected: $\eta=0.37$, $h/\lambda=8.4\%$ in the parallel resonator in the transmit filter; $\eta=0.7$, $h/\lambda=8.4\%$ in the series resonator in the transmit filter; $\eta=0.65$, $h/\lambda=9.4\%$ in the parallel resonator in the receive filter; $\eta=0.65$, $h/\lambda=11.2\%$ in the series resonator in the receive filter. This duplexer thus has three different relative layer thicknesses and three different metallization ratios.

In another embodiment, the following parameters are selected: $\eta=0.65$, $h/\lambda=7.0\%$ in the parallel resonator in the transmit filter; $\eta=0.7$, $h/\lambda=8.4\%$ in the series resonator in the transmit filter; $\eta=0.33$, $h/\lambda=11.2\%$ in the parallel resonator of the receive filter; $\eta=0.7$, $h/\lambda=11.2\%$ in the series resonator of the receive filter. This duplexer thus has three different relative layer thicknesses and three different metallization ratios.

In an advantageous embodiment, each filter of the duplexer (transmit and receive filter) is formed with a uniform layer structure and uniform layer thickness within it. At least one of these parameters, preferably the layer thickness, is selected to be different in the transmit filter and in the receive filter.

A duplexer has two electrically connected filters, the center frequencies of which differ by less than 15%. Therefore, the resonant frequencies of the component structures differ by less than 20% (frequency-proximate component structures). The invention can also be transferred to components whose component structures have resonant frequencies differing to a larger extent from one another. The difference can also be more than 15%, e.g., 30%.

The absolute bandwidth of the filter is designated $\Delta f$ and its center frequency as $f_0$. The relative bandwidth is $\Delta f/f_0$. In order to realize a broadband high-frequency filter with low losses, a defined reflectivity should preferably be achieved in the respective component structure.

The upper limit of the stopband of the parallel resonator, which lies inside the filter's passband, often causes undesired acoustic oscillations which become noticeable as a ripple in the transmission function. In order to shift this boundary of the stopband of the parallel resonator into a range outside the passband, the magnitude r of mechanical reflectivity should satisfy the following condition: $r \geq (\pi/2)(\Delta f/f_0)$. This can be achieved (for a given material of the electrodes and with a given metallization ratio) with a relative layer thickness $h/\lambda$ that exceeds a specific limit value $(h/\lambda)_{min}$. For electrodes of aluminum, for example, the following holds for $\Delta f/f_0 > 5.5\%$: $r > 8.63\%$ and $h/\lambda > 7\%$ to 9%. The dependency $r(h/\lambda)$ is a function that depends on the material of the electrodes and the substrate. The metallization ratio is preferably selected from the range $0.6 < \eta < 0.7$, e.g., $\eta=0.65$. A low relative layer thickness is preferred.

The component structure are arranged on a substrate that is piezoelectric or constitutes a layer structure with at least one piezoelectric layer. The piezoelectric layer, which is preferably the top layer of the layer structure, can constitute, for example, a film with piezoelectric properties. The substrate is preferably $LiTaO_3$ (lithium tantalate) or $LiNbO_3$ (lithium niobate). The multilayer substrate can comprise a sublayer of these materials.

The component can have a conductor that either connects the component structures among one another, or one of the component structures to a contact surface. The conductor can have a layer structure that comprises the layer structure of the first and/or the second component structure. The overall layer thickness of the conductor can be equal to the sum of the overall layer thicknesses of the first and the second component structures. The layer structure of the conductor can also have at least one additional sublayer. In this case, the overall layer thickness of the conductor can be greater than the sum of the layer thicknesses of the first and the second component structures. The conductors and/or the electrode structures of the component structures can be passivated.

The invention will be described in detail below on the basis of embodiments and the associated figures. The figures show various embodiments of the invention on the basis of schematic representation not drawn to scale. Identical or identically acting parts are labeled with identical reference characters. Shown schematically or in part are.

DESCRIPTION OF THE DRAWINGS

DETAILED DESCRIPTION

A component that has two component structures BS1 and BS2 is shown in each of FIGS. 1-9. Component structures BS1, BS2 are formed of different metals, metal alloys, or of layered metal structures, depending on the embodiment. Component structures BS1, BS2 are arranged on a piezoelectric substrate SU. The two component structures BS1, BS2 are component parts of one and the same filter.

Figure 7A:
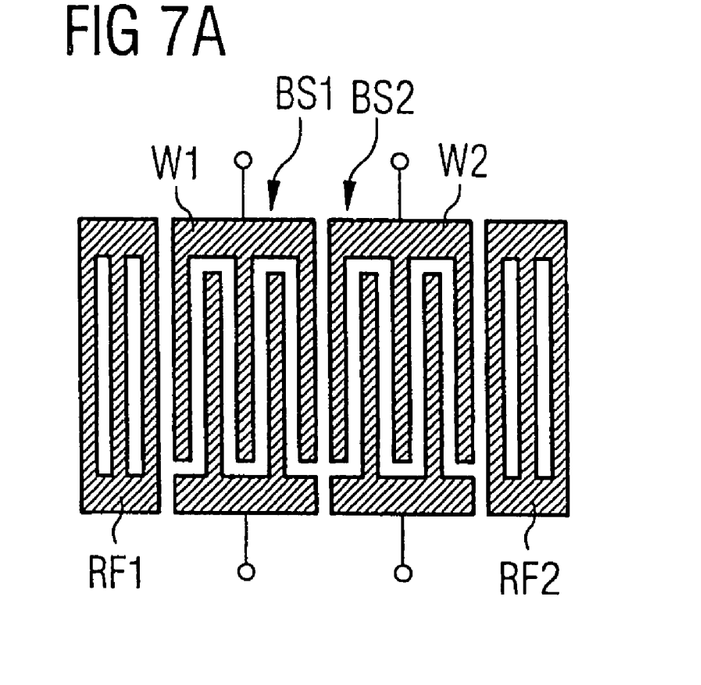
FIGS. 7a, 7b, respectively, a plan view from above of a component with two transducers in an acoustic track.
Figure 7B:
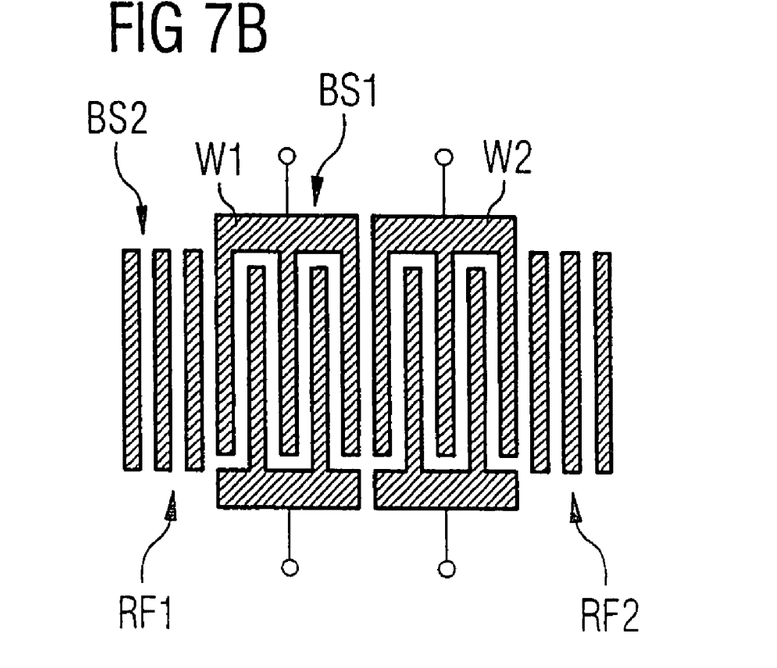
Figure 9:
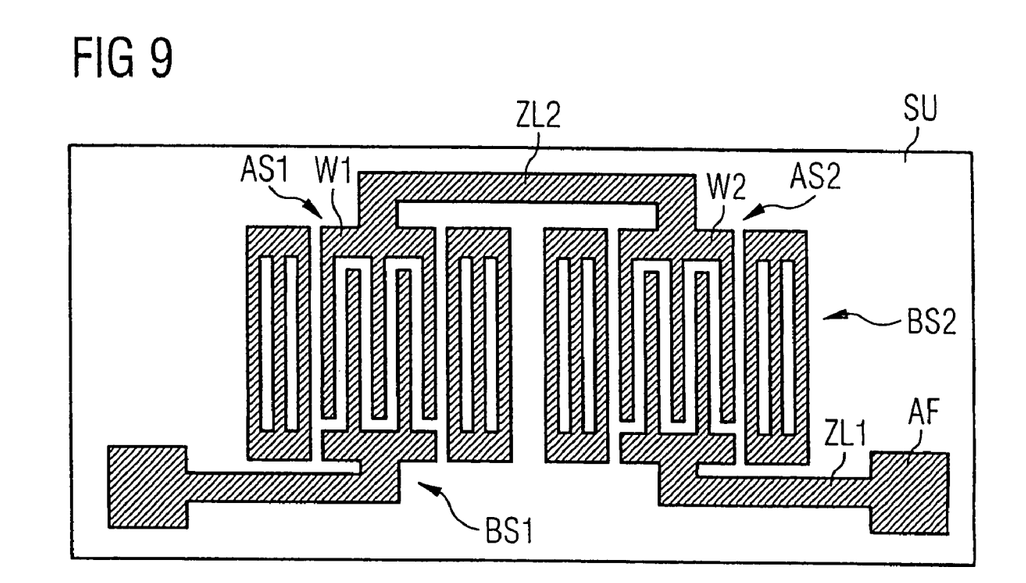
FIG. 9, the view from above of a component with a conductor.

In principle, component structure BS1, BS2 can be a transducer or a reflector. The schematic plan view of an example of a transducer W1, W2 or a reflector RF1, RF2 is shown in FIGS. 7a, 7b and 9. The transducers can be normal interdigital transducers that are connected to different electrical potentials.

First component structure BS1 has an absolute layer thickness h1. Second component structure BS2 has a greater layer thickness h2>h1 in FIGS. 1-3, 5 and 6. Second component structure BS2 can have a lesser layer thickness h2<h1.

First component structure BS1 is formed by a first transducer W1 in FIGS. 1, 3, 7a and 7b. Second component structure BS2 is formed by a transducer W2 (e.g., in FIGS. 1 and 7a) or by reflectors RF1, RF2 (e.g., in FIGS. 3 and 7b). Reflector RF1, RF2 has several metal strips, short-circuited to one another in one embodiment, that are oriented transverse to the direction of wave propagation, cf. FIG. 7a, for instance. In an embodiment (shown, for example, in FIG. 7b), the metal strips of a reflector are not electrically connected to one another.

First component structure BS1 or second component structure BS2 can be formed in FIGS. 2 and 4-6 by a transducer or a reflector. It is possible, for instance, for component structures BS1, BS2 to be transducers W1, W2 arranged in an acoustic track. In one embodiment, component structure BS1 represents a transducer, and second component structure BS2 represents a reflector, or vice versa.

Figure 1:
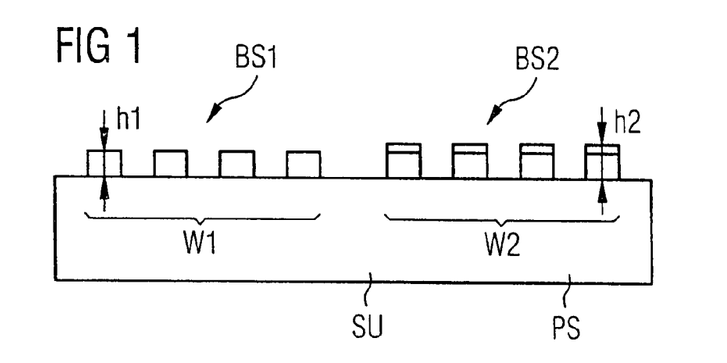
FIG. 1 is a component in which the component structures with different thicknesses are transducers arranged in an acoustic track, in a schematic cross section.

In the embodiment presented in FIG. 1, substrate SU is formed by piezoelectric layer PS. Transducers W1, W2 are arranged in an acoustic track. The plan view of the transducer arrangement presented in FIG. 1 is shown in FIG. 7a.

Figure 2:
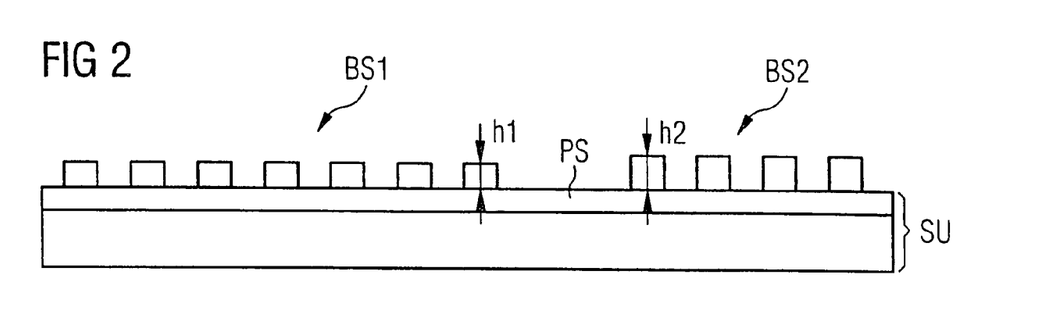
FIG. 2 is a component, in which the component structures with different layer thicknesses are arranged in different acoustic tracks, in schematic cross section.

An additional component in which component structures BS1, BS2 with different thickness are arranged in different acoustic tracks is shown in FIG. 2. Here, substrate SU is a multilayer structure with a piezoelectric sublayer PS.

As in the embodiment shown in FIG. 2, component structures BS1, BS2 can each consist of a single layer where the layer thicknesses h1, h2 of the two component structures BS1, BS2 are different from one another h1≠h2.

Figure 3:
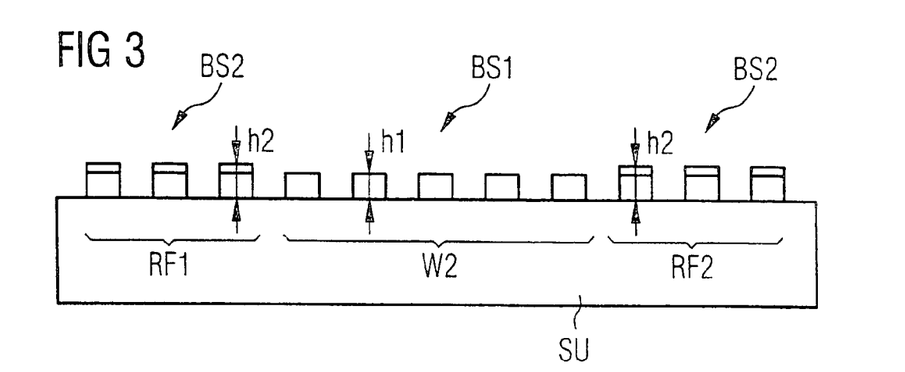
FIG. 3 is a component in which the component structures with different layer thicknesses are a transducer and two reflectors, in schematic cross section.

A component in which first component structure BS1 is a transducer W1 and second component structure BS2 is a reflector RF1 or RF2 is shown in FIG. 3. Transducer W1 and reflectors RF1, RF2 are arranged in a common acoustic track. The two reflectors RF1, RF2 here have the same layer thickness, which differs from the layer thickness of transducer W1. The arrangement of transducer W1 and reflectors RF1, RF2 shown in FIG. 3 correspond to an acoustic resonator or an acoustic track, e.g., track AS1 as in FIG. 9.

Figure 4:
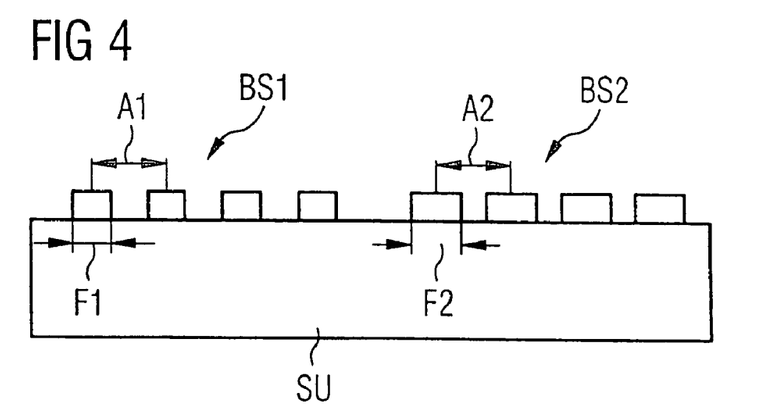
FIG. 4 is a component in which the component structures with different compositions additionally have different metallization ratios (cross section).

FIG. 4 shows a component in which component structure BS1, BS2 have a different chemical composition. The component structure further comprise differing metallization ratios $\eta 1$ and $\eta 2 > \eta 1$. Metallization ratio $\eta 1 = F1/A1$ of the first component structure is determined as the ratio of finger width F1 to distance A1 between the centers of the fingers. Metallization ratio $\eta 2 = F2/A2$ of the second component structure is determined as the ratio of finger width F2 to distance A2 between the centers of the fingers.

Figure 5:
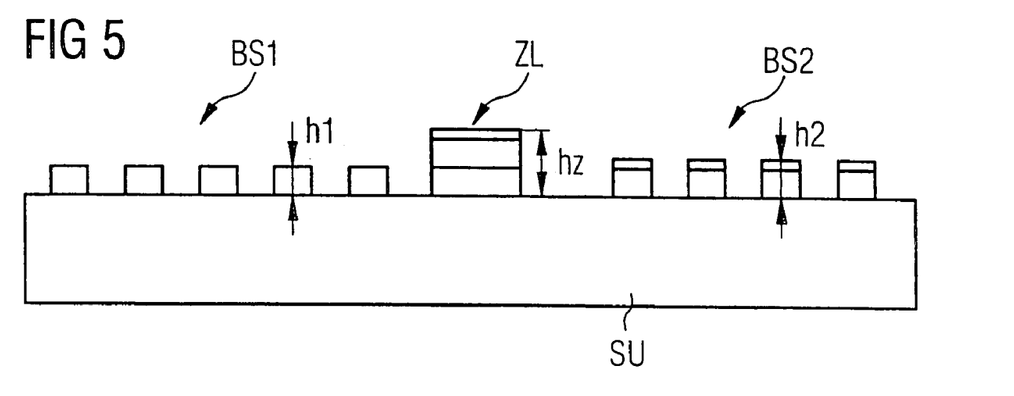
FIG. 5, a component with two component structures and a conductor (cross section).

In FIG. 5, a component structure with a conductor ZL is shown. In this case height $h_z$ of the layer structure of conductor ZL is equal to the sum of layer thicknesses h1 and h2.

Figure 6:
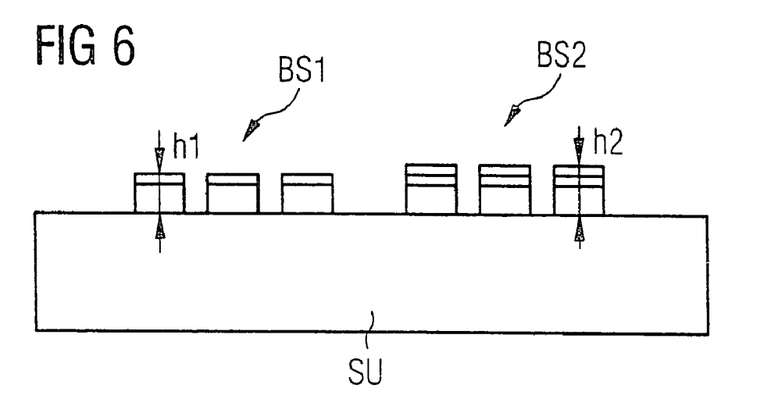
FIG. 6, a component in which the component structures each have several sublayers (cross section).

A component in which both first component structure BS1 and second component structure BS2 consist of several sublayers is shown in FIG. 6. Component structure BS1 has sublayers arranged one above the other. Second component structure BS2 has three sublayers arranged one above the other.

An SAW component with two transducers W1, W2 arranged in an acoustic track is shown in FIGS. 7a and 7b. The acoustic track is bounded by reflectors RF1, RF2. Component structure BS1 corresponds to first transducer W1, and second component structure BS2 corresponds to second transducer W2 in FIG. 7a and to RF1 in FIG. 7b, respectively. Component structures BS1, BS2 with different heights are preferably arranged directly next to one another in an acoustic track, as in FIGS. 7a, 7b.

Figure 8A:
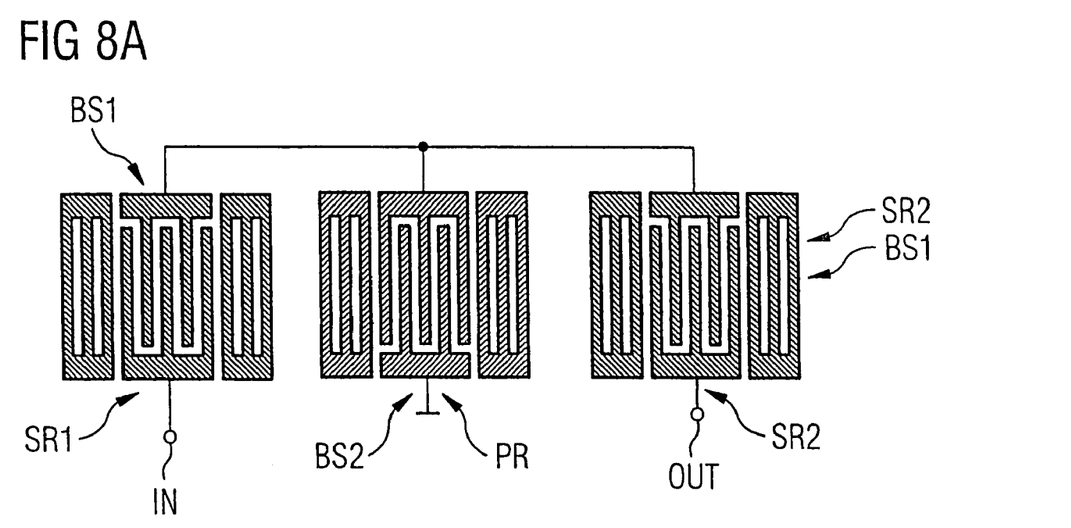
FIGS. 8a, 8b, respectively, a filter in a ladder-type arrangement.
Figure 8B:
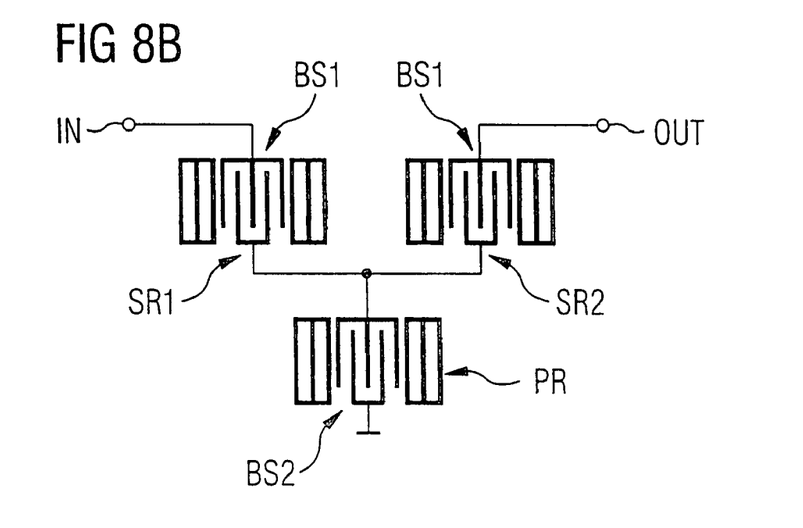

A section of a filter with ladder-type arrangement is shown in FIGS. 8a, 8b. The signal path is arranged between terminals IN and OUT. The filter has series resonators SR1, SR2 arranged in the signal path, and a parallel resonator PR arranged in a shunt arm. Series resonators SR1 and SR2 correspond to first component structure BS1. Parallel resonator PR corresponds to second component structure BS2. The filter can have several shunt arms with parallel resonators arranged therein. Resonators SR1, SR2, PR are each arranged in the acoustic tracks, which preferably run parallel to one another A section of a component with conductors ZL1, ZL2 is shown in FIG. 9. First conductor ZL1 connects a connection surface AF to acoustic track AS2. Second conductor ZL2 electrically connects two acoustic track AS1, AS2.

Figure 10:
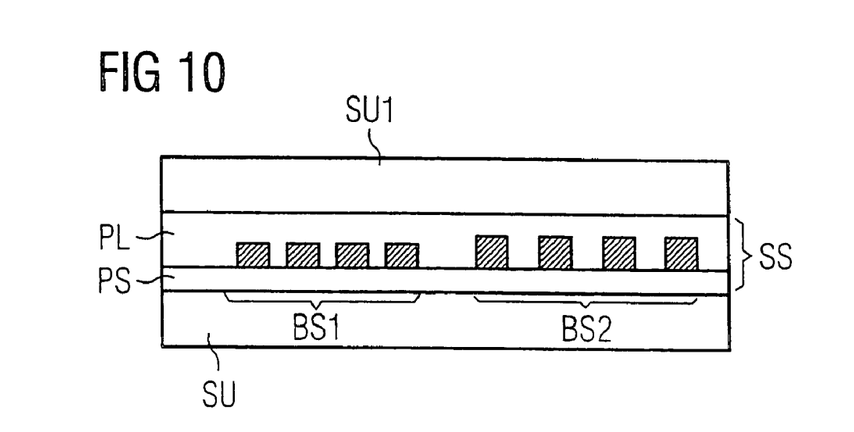
FIG. 10, a component operating with guided acoustic waves (cross section).

FIG. 10 shows an additional embodiment of a component in a schematic cross section. The component comprises a first substrate SU, a second substrate SU1 and a layer system SS arranged therebetween. Layer system SS comprises a piezoelectric layer PS, a metal layer arranged thereon and a dielectric layer arranged above, which form a planarization layer PL. Component structures BS1 and BS2, as well as a contact surface (not shown here), are formed in the metal layer. The piezoelectric layer is preferably formed from ZnO or AlN.

The first and second substrate are preferably formed from silicon. The substrates can consist, for example, of glass, $SiO_2$, ZnO, $LiNbO_3$, $LiTaO_3$, or at least comprise a layer of the materials mentioned here.

Planarization layer PL preferably consists of silicon oxide of silicon nitride.

The invention is not limited to the embodiments, specific materials or number of illustrated elements presented here. The embodiments according to FIGS. 1-9 can also be applied to a component operating with guided acoustic waves, shown schematically in FIG. 10.

The invention claimed is:

1. A component comprising:
   a first filter comprising a first structure, the first structure comprising one of a transducer and a reflector, the first filter further comprising a second structure, the second structure comprising one of a transducer and a reflector;
   a substrate on which the first and second structures are arranged; wherein:
   the first structure has an approximately uniform layer thickness and an approximately uniform composition,
   the second structure has an approximately uniform layer thickness and an approximately uniform composition, and
   at least one of the layer thickness and composition of the first structure differs from the layer thickness or composition of the second structure, and
   the component is configured to operate with acoustic waves;
   wherein the first structure is in a first acoustic track comprising a series resonator and has a uniform metallization ratio, the second structure is in a second acoustic track comprising a parallel resonator and has a uniform metallization ratio, the metallization ratio of the first structure being different than the metallization ratio of the second structure; and wherein the metallization ratio in the parallel resonator is less than the metallization ratio in the series resonator.

2. The component of claim 1, wherein the first structure comprises an electrically conductive layer and the second structure comprises an electrically conductive layer.

3. The component of claim 1, wherein the layer thickness of the first structure and the layer thickness of the second structure differ.

4. The component of claim 1, wherein:
the first structure comprises a first material and the second structure comprises a second material, the second material being different from the first material.

5. The component of claim 1, wherein the first and second structures comprise a same material.

6. The component of claim 1, wherein the first and second structures each comprise a plurality of electrically conductive layers.

7. The component of claim 6, wherein:
the first structure comprises a first layer sequence having a first set of heights; and
the second structure comprises a second layer sequence that is the same as the first layer sequence, the second layer sequence having a second set of heights that is different than the first set of heights.

8. The component of claim 1, wherein:
the first structure comprises a single electrically conductive layer, and
the second structure comprises a plurality of electrically conductive sublayers.

9. The component of claim 8, wherein one sublayer of the plurality of electrically conductive sublayers included in the second structure comprises the electrically conductive layer included in the first structure.

10. The component of claim 1, wherein the first structure is in a first acoustic track and the second structure is in a second acoustic track, the first acoustic track being different from the second acoustic track.

11. The component of claim 10, wherein resonant frequencies of the first and second acoustic tracks differ by, at most, about 40%.

12. The component of claim 11, wherein the resonant frequencies of the first and second acoustic tracks differ by from about 0% to about 20%.

13. The component of claim 12, wherein the resonant frequencies of the first and second tracks differ by from about 0% to about 10%.

14. The component of claim 1,
further comprising N acoustic tracks where $N \geq 3$ the N acoustic tracks each having a uniform layer thickness inside the acoustic tracks and a uniform composition, and each of the N acoustic tracks having properties different from one another regarding at least one of a layer thickness and a composition.

15. The component of claim 14, wherein a lowest relative layer thickness of a component structure $h/\lambda$ is $\geq 5\%$, where h is an absolute layer thickness and $\lambda$ is an acoustic wavelength.

16. The component of claim 15, wherein $5\% \geq h/\lambda \geq 14\%$.

17. The component of claim 1, further comprising a second filter, wherein the first and second filters form a duplexer, the second filter comprises a uniform layer structure and a uniform layer thickness, and the layer thicknesses of the component structures of the first filter are different from the layer thicknesses of the component structures of the second filter.

18. A component comprising:
a first filter comprising a first structure, the first structure comprising one of a transducer and a reflector, the first filter further comprising a second structure, the second structure comprising one of a transducer and a reflector;
a substrate on which the first and second structures are arranged; wherein:
the first structure has an approximately uniform layer thickness and an approximately uniform composition,
the second structure has an approximately uniform layer thickness and an approximately uniform composition, and
at least one of the layer thickness and composition of the first structure differs from the layer thickness or composition of the second structure, and
the component is configured to operate with acoustic waves;
wherein the component further comprises:
an additional substrate,
a layer system comprising:
a piezoelectric layer between the substrate and the additional substrate,
a metal layer, in which the first and second component structures are located, the metal layer being on the piezoelectric layer, and
a dielectric layer that covers the two component structures and seals to the surface of the piezoelectric layer.

* * * * *

UNITED STATES PATENT AND TRADEMARK OFFICE
CERTIFICATE OF CORRECTION

PATENT NO. : 7,692,515 B2
APPLICATION NO. : 11/659166
DATED : April 6, 2010
INVENTOR(S) : Markus Hauser et al.

Page 1 of 1

It is certified that error appears in the above-identified patent and that said Letters Patent is hereby corrected as shown below:

Col. 10, line 2, after "$N \geq 3$" insert --,--.

Signed and Sealed this

Twenty-second Day of June, 2010

David J. Kappos
*Director of the United States Patent and Trademark Office*